United States Patent [19]

Butler

[11] Patent Number: 5,705,950

[45] Date of Patent: Jan. 6, 1998

[54] HYBRID SOLID STATE/VACUUM TUBE AUDIO AMPLIFIER

[76] Inventor: Brent K. Butler, 6806 S. Norfolk St., Aurora, Colo. 80016

[21] Appl. No.: 601,758

[22] Filed: Feb. 15, 1996

[51] Int. Cl.$^6$ ........................................ H03F 1/34
[52] U.S. Cl. .................. 330/3; 330/98; 330/100; 330/293; 381/61; 381/121
[58] Field of Search ........................ 330/3, 65, 98, 330/99, 100, 293; 381/61, 120, 121

[56] References Cited

U.S. PATENT DOCUMENTS

| | | |
|---|---|---|
| 3,842,703 | 10/1974 | Okamoto et al. . |
| 4,127,049 | 11/1978 | Ichigaya . |
| 4,495,640 | 1/1985 | Frey . |
| 4,672,671 | 6/1987 | Kennedy . |
| 4,701,957 | 10/1987 | Smith . |
| 4,890,331 | 12/1989 | Brown, Sr. et al. . |
| 5,012,199 | 4/1991 | McKale . |
| 5,023,915 | 6/1991 | Brown, Sr. et al. . |
| 5,127,059 | 6/1992 | Elion et al. . |
| 5,133,014 | 7/1992 | Pritchard . |
| 5,343,159 | 8/1994 | Butler ................................. 330/3 |

*Primary Examiner*—James B. Mullins
*Attorney, Agent, or Firm*—Harness, Dickey & Pierce, P.L.C.

[57] ABSTRACT

In this hybrid amplifier circuit the vacuum tube is direct coupled or DC coupled to the output of a solid state amplifier in a cathode follower configuration. An automatically operative bypass component, such as a Zener diode, LED, transistor junction or relay, diverts the signal output of the solid state amplifier around the vacuum tube stage when bias conditions or other vacuum tube operating conditions signify that the vacuum tube is still warming up or for some reason inoperative. Thus the hybrid circuit produces amplification at full volume and at low distortion even while the vacuum tube is warming up. The vacuum tube provides a desirable warming coloration to the sound that may be user adjusted by controlling the level of closed loop feedback within the circuit. Lower total harmonic distortion is achieved in a pentode vacuum tube device by direct coupling the screen and control grids. Lower voltage use of power pentodes wired in nonconventional "triode mode" is achieved.

28 Claims, 5 Drawing Sheets

HYBRID SOLID STATE/VACUUM TUBE AUDIO AMPLIFIER

TECHNICAL FIELD

The present invention relates generally to audio amplifiers and more particularly to a hybrid solid state/vacuum tube amplifier that combines the advantages of both semiconductor and vacuum tube amplifier technology to produce an audio output signal having a level of vacuum tube coloration that is controllable by the operator, and that also includes a vacuum tube bypass to ensure amplifier operation even during vacuum tube warm-up and/or vacuum tube failure. Substantially reduced voltage levels of tube operation are also employed for unique tonal characteristics and extended tube life.

BACKGROUND

Solid state amplifiers have become the standard in virtually every audio amplification application ranging from automotive sound to stereo hi-fi and home theater surround sound to professional sound reinforcement applications. While solid state amplifiers provide compact, low cost and high performance, there remain some audiophiles who long for the days of the vacuum tube amplifier and its characteristically warmer sound. Indeed, some audiophiles still use vintage vacuum tube amplifiers in place of modern-day solid state ones; and a large number of professional musicians use vacuum tube instrument amplifiers and vacuum tube preamplifiers and power amplifiers to achieve a desirably warmer tone and sweeter sustain.

While it is difficult to know the precise psychoacoustic reasons why vacuum tube amplifiers sound better, one theory is that the vacuum tube circuits introduce very slight even ordered harmonic distortion as the tube begins to saturate. In contrast, solid state transistorized amplifiers introduce odd harmonic distortion when overdriven. Although circuit designers go to great lengths to avoid any type of distortion in an amplifier circuit, some distortion is always present nevertheless. Even ordered harmonic distortion is inherently more musical than odd ordered harmonic distortion. One reason for this may be that the musical scale itself is based upon even harmonics. The musical octave is simply a doubling in frequency (second order even harmonic). Thus the even harmonics tend to blend more naturally with the musical content, producing a warmer, richer sound. In contrast, the odd harmonics do not blend well with the musical content and tend to sound dissonant, more harsh and distorted-perceived by many as the addition of noise.

Due to the aforementioned packaging, cost and performance advantages of solid state amplifiers, there has been very little ongoing research and development into vacuum tube amplifiers today. It would be desirable to employ a hybrid technology, using both solid state and vacuum tube circuitry, to thereby enjoy the advantages of both. However, this is not easy to do because solid state circuits and vacuum tube circuits are conventionally biased at radically different voltages, making it difficult to couple the circuits together without use of signal degrading coupling capacitors and complex power supply circuits.

Also, from the end user's standpoint, hybrid circuits present operating problems, as today's consumer is relatively unfamiliar with the warm-up and maintenance requirements of vacuum tubes. It would therefore be desirable for the hybrid amplifier to begin operation instantly upon turn-on, as solid state amplifiers do, notwithstanding the fact that vacuum tube circuits can require a few seconds or up to a minute or more to fully warm up and begin operating. Vacuum tube circuits of the past addressed this requirement by connecting power to the tube filaments at all times to achieve a "stand-by" operating mode that was also termed "instant on." Of course, the requirement that the tube must be supplied with power at all times rules out many portable or battery-operated applications. Since vacuum tubes traditionally operate at high voltage potentials (especially power pentode types), they are subject to wear out or failure. Methods to prolong tube life and provide for fail-safe operation of the circuit are therefore desirable.

SUMMARY OF THE INVENTION

The present invention provides a hybrid solid state/ vacuum tube amplifier that exhibits many of the advantages of both solid state and vacuum tube amplifier technologies, while eliminating many of the disadvantages of the aforementioned technologies. The audio amplifier of the present invention adds a level of vacuum tube coloration to an audio input signal via a vacuum tube. The hybrid amplifier of the present invention also allows an amplifier operator to tailor the level of vacuum tube sound coloration of the audio output signal. Further, the hybrid amplifier of the present invention ensures continued operation even during vacuum tube warm-up and/or vacuum tube failure or nonoperation. The present invention also employs substantially reduced operating voltages which prolongs tube life and associated components.

In one aspect, the present invention provides an amplifier circuit for coloring an audio signal. The amplifier includes an audio signal input and a solid state amplifier coupled to the input for amplifying an input audio signal. A vacuum tube is direct coupled or DC coupled to the solid state amplifier for adding a certain level of coloration to the audio signal. In addition, an automatically operating vacuum tube bypass is coupled between the solid state amplifier and the vacuum tube to provide an audio signal bypass around the vacuum tube in response to certain threshold vacuum tube conditions.

In another aspect, the invention provides a hybrid amplifier in which a second feedback loop is applied between the signal input and the signal output for controlling the level of coloration added by the vacuum tube. Particularly, this second feedback loop may include a potentiometer that allows operator adjustment of the level of coloration added by the vacuum tube.

In another aspect, the invention employs a unique manner of biasing and coupling the vacuum tube in the hybrid circuit that significantly reduces undesirable total harmonic distortion. In particular, a pentode vacuum tube is configured as a cathode follower. The control grid and screen grid are directly coupled together. This produces significantly lower total harmonic distortion. If desired, the plate need not be coupled to the circuit; the vacuum tube nevertheless provides the desired warming effect. The plate may alternatively be directly coupled to the control grid (and screen grid) with the warming effect still being produced.

For a more complete understanding of the invention, its objects and advantages, reference may be had to the following specification, the accompanying drawings and the appended claims.

DETAILED DESCRIPTION OF THE PREFERRED EMBODIMENTS

Figure 1:
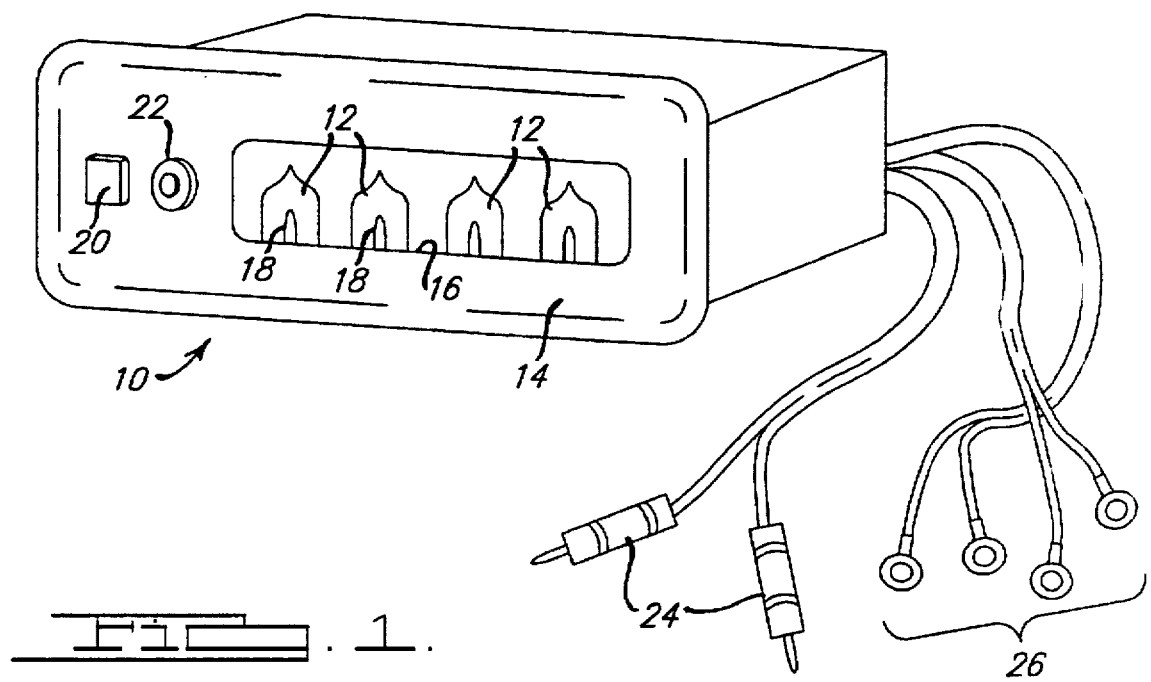
FIG. 1 is a perspective view of one manner of packaging the hybrid amplifier of the invention.

The hybrid solid state/vacuum tube audio amplifier is shown in an exemplary package configuration in FIG. 1. The hybrid amplifier 10 may employ a plurality of vacuum tubes 12. If desired, the amplifier enclosure 14 may include a window 16, allowing the vacuum tubes to be visible and also allowing for ample air circulation around the vacuum tubes. In one embodiment, neon bulbs 18 are positioned behind the vacuum tubes to illuminate the tubes when the circuit is operating. In FIG. 1 the neon bulbs are positioned behind vacuum tubes 12. If desired, the neon bulbs can be configured to illuminate the tubes only when the vacuum tube portion of the hybrid amplifier is operative. In this way, the user can visually determine when the vacuum tube warming circuitry is in use.

The hybrid amplifier has an on/off button 20 and a warming effect adjustment knob 22. The adjustment knob is connected to a potentiometer that adjusts the degree to which the warming effect of the vacuum tubes is introduced. Several of the circuit embodiments illustrated below include a potentiometer for this purpose.

The hybrid amplifier includes input leads 24 and output leads 26 for coupling the amplifier between a source of audio material and a speaker system. Naturally, the specific connectors for this purpose will depend on the type of system being implemented. Thus, although phono jacks and speaker terminal post connectors have been illustrated in FIG. 1, other configurations are possible. For example, the hybrid amplifier may be designed to function as a signal processor or preamplifier stage for driving a subsequent power amplifier. In this case, the output may be electrically configured to provide a line level signal suitable for insertion into an audio power amplifier.

Also, the embodiment illustrated in FIG. 1 is configured as a stereo amplifier, having two input leads for the left and right channels and having suitable output leads to drive a pair of audio speakers. Naturally, the hybrid amplifier can be packaged in fewer or greater number of channels to accommodate both monoral and multichannel surround sound applications. Both 110-120 VAC operation and 12 volt auto sound versions are envisioned.

Figure 2:
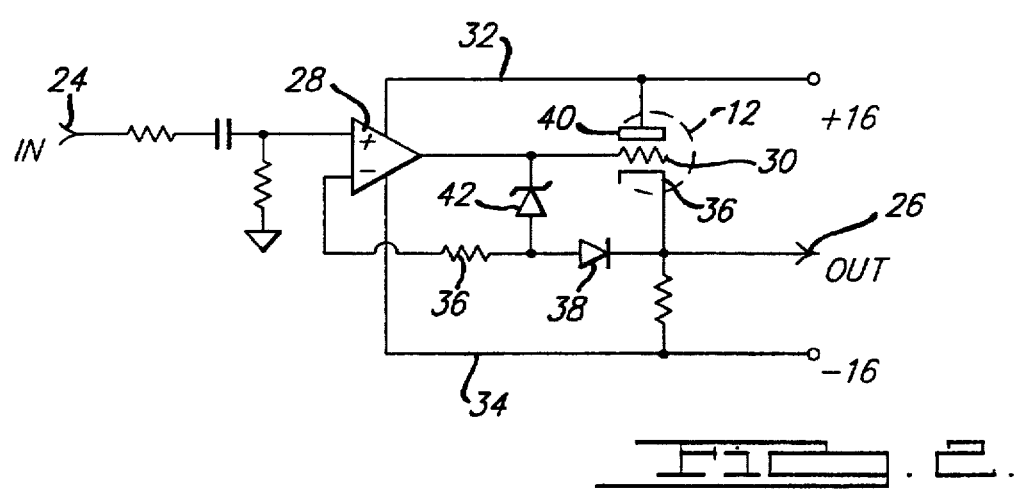
FIG. 2 is a schematic diagram illustrating a first preferred embodiment of the present invention.

At the heart of the hybrid amplifier 10 is a vacuum tube device that is direct coupled or DC coupled to a solid state amplifier. FIG. 2 illustrates a simple embodiment of the circuit in which the solid state amplifier takes the form of an operational amplifier 28 having an output that is directly coupled to the control grid 30 of vacuum tube 12. In the embodiment of FIG. 2 the operational amplifier 28 is powered from positive and negative DC supply rails 32 and 34. The positive and negative supply rails may be coupled to a suitable power supply for providing sufficient voltage to operate the operational amplifier. In the embodiment of FIG. 2 the positive and negative supply rails are at +16 and −16 volts, respectively. Note the input lead 24 is coupled to one input of the operational amplifier and the output lead 26 is coupled to the cathode 36 of vacuum tube 12. A suitable feedback resistor 36 places negative feedback on operational amplifier 28. Diode 38 is an optional blocking diode. If desired, diode 38 can be eliminated from the circuit, in which case feedback resistor 36 would be directly coupled to the cathode 36, placing both the operational amplifier and the vacuum tube in the feedback control loop.

Vacuum tube 12 is coupled in a cathode follower configuration. In essence, vacuum tube 12 follows the signal input on grid 30, providing essential no signal gain but lowering the impedance as seen at the output lead 26. The plate 40 of vacuum tube 12 is coupled to the positive supply rail 32 in the illustrated embodiment. As will be seen in connection with FIG. 7, discussed below, it is possible to construct a hybrid amplifier circuit according to the principles of the invention while leaving the plate 40 disconnected from the circuit altogether. Additionally, the plate 40 may be connected directly to the control grid 30 eliminating the need for connection of plate 40 to a positive power supply.

It is worth noting that the vacuum tube 12 is direct coupled or DC coupled to the output of operational amplifier 28. This is different from conventional design in which a capacitor is ordinarily used to couple one amplifier stage to another. Also note that the operational amplifier and vacuum tube may be operated from the same power supply. That is, the operational amplifier and the vacuum tube are both powered from the positive and negative supply rails. This arrangement is not ordinarily encountered in hybrid circuits, inasmuch as traditional vacuum tube circuitry is ordinarily powered at extremely high voltages that would be unsuitable for use with solid state operational amplifiers.

The hybrid amplifier circuit also includes a vacuum tube bypass component that switches the vacuum tube in and out of the circuit, preferably automatically. In the embodiment illustrated in FIG. 2 the bypass component takes the form of a Zener diode 42, although other devices may be employed. For example, the Zener diode 42 could be replaced by a conventional diode or several diodes in series, a light-emitting diode (LED) or by a transistor junction. Alternatively, the vacuum tube bypass component could be a timed relay or current control led relay. The vacuum tube bypass component operates to divert the output of operational amplifier 28 directly to output lead 26, while the vacuum tube is in the process of warming up at initial turn on time. The bypass component also functions to divert the output of operational amplifier 28 to output lead 26 in the event the vacuum tube should fail for some reason.

To understand how the Zener diode (or its equivalent) functions, consider the circuit of FIG. 2 at initial turn on time. When first turned on, vacuum tube 12 has not yet warmed up, hence it conducts no current and appears as essentially an open circuit. Zener diode 42 may be, for example, a 2 volt Zener diode. Thus, due to pull-down resistor 37, at initial turn on time, the voltage across the Zener diode would be nominally 2 volts. At initial turn on time the voltage at cathode 36 would be essentially at the voltage of the negative supply rail 34 (i.e. −16 volts) if said Zener diode (or other bypassing means) were not employed.

With the vacuum tube in a nonconducting state, and the Zener diode biased for conduction, the output of operational amplifier 28 is diverted through the Zener diode to the output lead 26. Thus the operational amplifier, alone, initially supplies the audio signal to the output lead 26. As the tube begins to warm up, it slowly begins to conduct and the voltage on cathode 36 begins to rise, approaching the voltage at the grid 30. At some point the voltage on cathode 36 will rise to the point that Zener diode 42 can no longer conduct. When this occurs, the audio signal that was flowing from the output of operational amplifier 28 to output lead 26 no longer flows through the Zener diode and instead begins to flow through the vacuum tube, from grid 30 to cathode The advantage of using a Zener diode or other suitable solid state junction, such as a light emitting diode or a transistor junction, is that the vacuum tube bypass component functions automatically, based on naturally occurring warm-up characteristics of the vacuum tube. Note the use of an LED (light-emitting diode) as the bypass element provides for a novel and practical means of giving a visual indication of the "warm-up" or "failed tube" status and may be mounted on the front panel of the embodiment illustrated in FIG. 1. This is possible since the LED will only be illuminated during warm-up or inoperation of the tube. An alternate embodiment might be to employ a current-controlled relay or a timer-controlled relay to connect grid 30 to cathode 36 of the vacuum tube as the circuit is warming up.

Another important benefit of the bypass component is that it prevents potentially damaging voltages from being applied to the output lead 26 when the circuit is first turned on. Without the bypass component, and with the vacuum tube in its initial nonconductive (open circuit) condition, the output lead 26 voltage level is essentially equal to the negative supply rail 34 due to pull-down resistor 37. In the case where output 26 is DC or directly coupled to the output power devices of an amplifier, this would cause a negative voltage to be applied to the speaker, resulting in severe DC offset at the output terminal of the amplifier and causing potential speaker damage.

The basic hybrid amplifier circuit illustrated in FIG. 2 can be incorporated into a wide variety of different circuits. Several examples are illustrated here.

Figure 3:
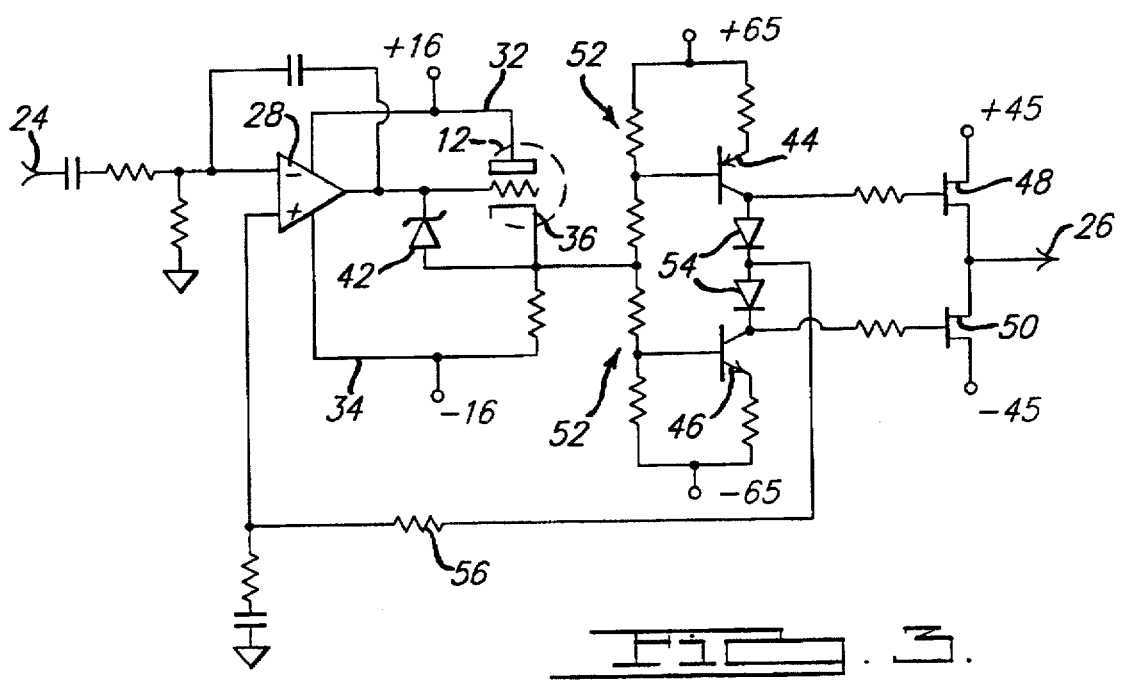
FIG. 3 is a schematic diagram illustrating a second preferred embodiment of the present invention.

Referring to FIG. 3, the operational amplifier 28 and vacuum tube 12 are incorporated as a predriver circuit into a multistage amplifier. The multistage amplifier employs bipolar predriver transistors 44 and 46 configured in a push/pull arrangement. The predriver transistors in turn drive two power MOSFETs 48 and 50.

Note the bypass component, Zener diode 42, is connected as previously described in FIG. 2. Bypass diode 38 is not shown, but may be employed. Comparing FIG. 2 and FIG. 3, note that the circuit in FIG. 3 illustrates one way to couple the input lead to the inverting input of the operational amplifier 28. In the embodiment of FIG. 2 the input is coupled to the noninverting input.

With reference to FIG. 3, the cathode 36 is coupled to the center of a resistive divider network 52 that splits the signal into its positive and negative excursions for application to the bipolar transistors 44 and 46 in push/pull fashion. Diodes 54 bias the transistors and provide a take off point for supplying negative feedback through feedback resistor As in the embodiment of FIG. 2, the operational amplifier 28 and vacuum tube 12 are direct coupled and supplied by common power supply rails 32 and 34. Bipolar transistors 44 and 46 and MOSFET transistors 48 and 50 are respectively powered by separate supply rails. In the illustrated embodiment the bipolar transistors are supplied power at ±65 volts and the MOSFET transistors are supplied power at ±45 volts, but these voltages may be higher or lower in actual production units.

Figure 4:
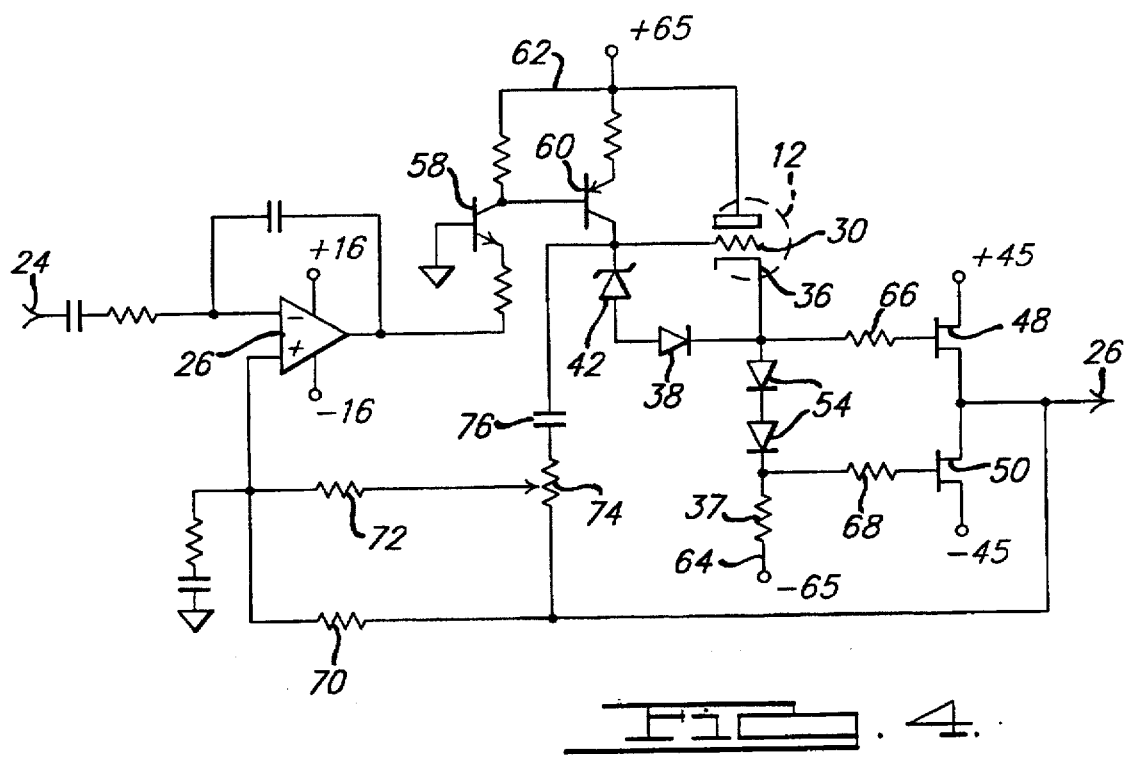
FIG. 4 is a schematic diagram illustrating a third preferred embodiment of the present invention.

FIG. 4 illustrates another embodiment that involves a somewhat different connection between the operational amplifier 28 and the vacuum tube 12. Transistor 58 is coupled as a single-ended emitter drive stage, with base grounded, that is in turn coupled in totem pole fashion to transistor 60. Transistor 58 provides essentially no gain but raises the DC voltage level of the signal closer to the positive supply rail 62 and properly biases "Class A" configured amplifier/driver transistor 60. In this case, the operational amplifier 28 and vacuum tube 12 are supplied operating voltages from different supply rails. The operational amplifier is supplied at ±16 volts and the vacuum tube is supplied at ±65 volts via supply rails 62 and 64. The bypass component, Zener diode 42, is connected between the control grid 30 and cathode 36 through the optional diode 38. One or more bias diodes couple the cathode 36 to pull-down resistor 37, allowing the Class A drive output signal to be supplied through resistors 66 and 68 for proper biasing and signal coupling to MOSFET transistors 48 and 50.

Feedback from the output lead 26 is supplied through resistor 70, which may be on the order of 1.5 megohms. This feedback provides an overall DC reference for the speaker. Local feedback through resistor 72 provides a means for adjusting the quality of the tube enhanced sound. Resistor 72 is coupled to the wiper terminal of potentiometer 74 and potentiometer 74 is in turn coupled through capacitor 76 to the feed point of tube 12 (as at grid 30). Potentiometer 74 is controlled by the adjustment knob 22 (FIG. 1) on the front panel of the amplifier enclosure. Local feedback through potentiometer 74 and resistor 72 precedes the vacuum tube stage. Hence the operational amplifier 26 is provided with adjustable closed loop control whereas the vacuum tube stage is outside of that loop. In the presently preferred embodiment the capacitor 76 may be on the order of 0.1 microfarad and the potentiometer may be on the order of 20K to 50K ohms, with resistor 72 being on the order of the same magnitude or greater. Capacitor 76 functions to supply frequency dependent feedback, with the feedback level being reduced at the lower frequencies. Reducing the feedback at lower frequencies has the effect of boosting the bass output of operational amplifier 26 prior to coloration by vacuum tube 12. By supplying vacuum tube 12 with a boosted bass level input, the tube produces a richer bass sound by adding subtle even harmonics. The feedback through resistor 72 is an AC feedback signal, whereas the feedback through resistor 70 is principally a DC level feedback, for the purpose of insuring a stable DC level at the speaker output. I have determined that the use of a large value (1.5 megohm) resistor at 70 eliminates the need to employ DC adjustment potentiometers to correct for the DC offset.

Figure 5:
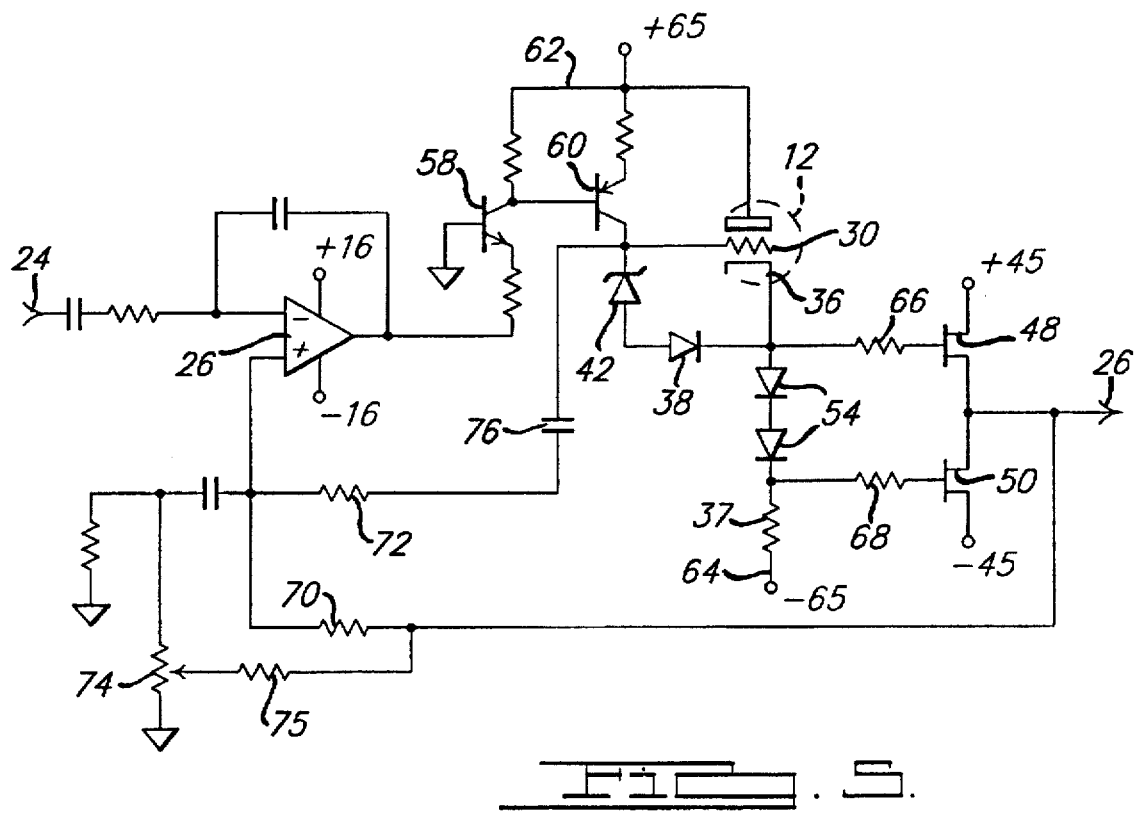
FIG. 5 is a schematic diagram illustrating a fourth preferred embodiment of the present invention.

An additional method of controlling tube enhancement is embodied in FIG. 5. This method is achieved by supplying overall feedback via resistor 75 to the wiper of variable resistor 74. Variable resistor 74 allows for adjustment of overall feedback and has the effect of not only adjusting the tube characteristics, but also increases overall gain as the tube characteristics are being enhanced. The shunting of overall output feedback from output 26 and increase of amplifier gain occurs as wiper of variable resistor 75 approaches ground potential.

Figure 6:
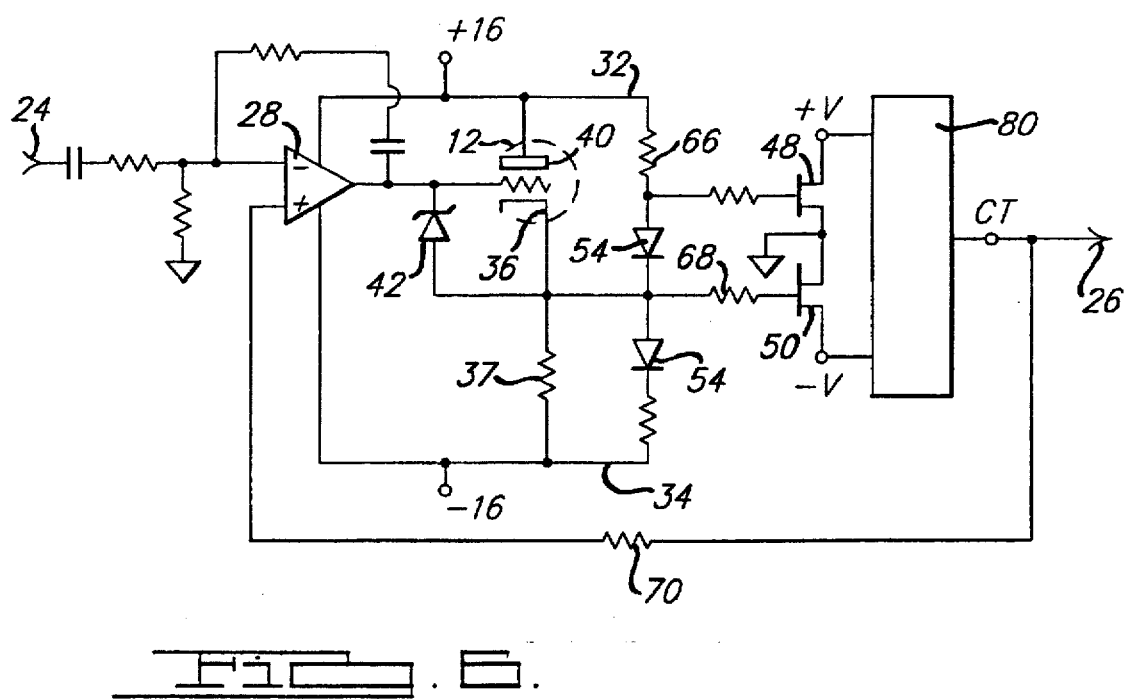
FIG. 6 is a schematic diagram illustrating a fifth preferred embodiment of the present invention.

Yet another embodiment is illustrated in FIG. 6. In FIG. 6 the operational amplifier 28, vacuum tube 12 and Zener diode 42 are connected essentially as taught in FIG. 2. The plate 40 of tube 12 is connected to the positive supply rail 32 and the cathode 36 is coupled through pull-down resistor 37 to the negative supply rail 34. The cathode output of the vacuum tube stage is connected at the midpoint node between diodes 54. The audio signal is supplied in push/pull fashion through resistors 66 and 68 to MOSFET transistors 48 and 50.

In this particular embodiment the MOSFET transistors do not drive the speaker terminal directly. Rather, the MOSFET transistors drive a floating power supply 80 and the center tap CT of power supply 80 supplies the output lead 26. DC feedback is supplied through resistor 70.

Figure 9:
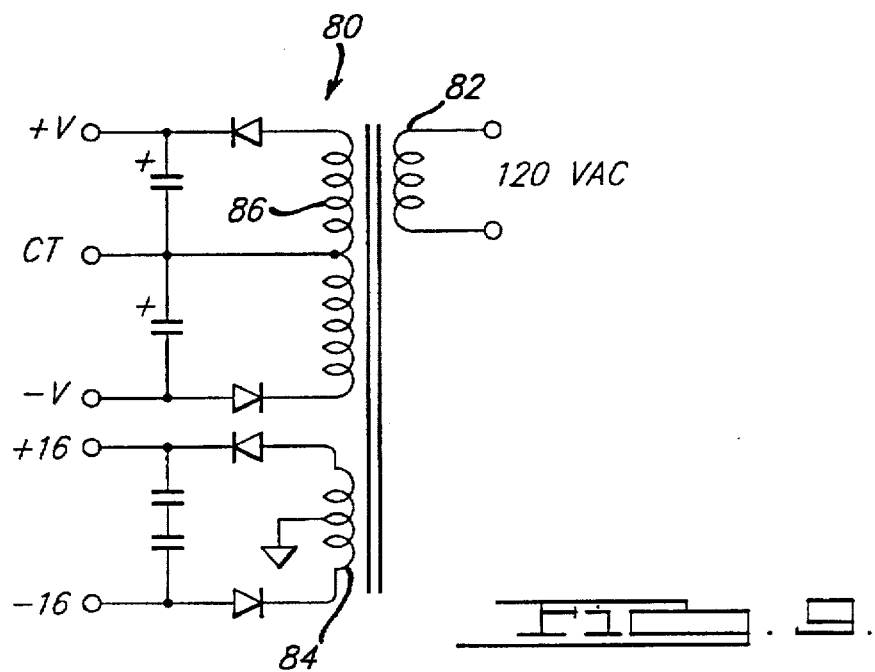
FIG. 9 is a schematic diagram of a power supply suitable for use with the embodiments of FIGS. 6 and 7.

The details of a suitable floating power supply have been illustrated in FIG. 9. Power supply 80 includes a primary winding 82 for coupling to a source of AC line voltage at nominally 120 volts. Voltage for the +16 and −16 supply rails is furnished by a low voltage secondary winding 84. Separate from the low voltage secondary winding is a high voltage secondary winding 86. This winding provides the +V and −V terminals that supply power to MOSFETs 48 and 50 (FIG. 6). The high voltage secondary winding is provided with a center tap CT that is coupled in the embodiment of FIG. 6 to the output lead 26. The power supply 80 employs suitable rectifiers and filtering capacitors to supply low ripple DC levels needed by the circuit. Although half wave rectification has been shown in FIG. 9 for simplicity, full wave rectification may be employed.

The circuit of FIG. 6 swings the floating power supply 80 up and down in response to the applied audio signal, producing an amplified audio signal on the center tap CT terminal that is connected to the output lead 26.

Figure 7:
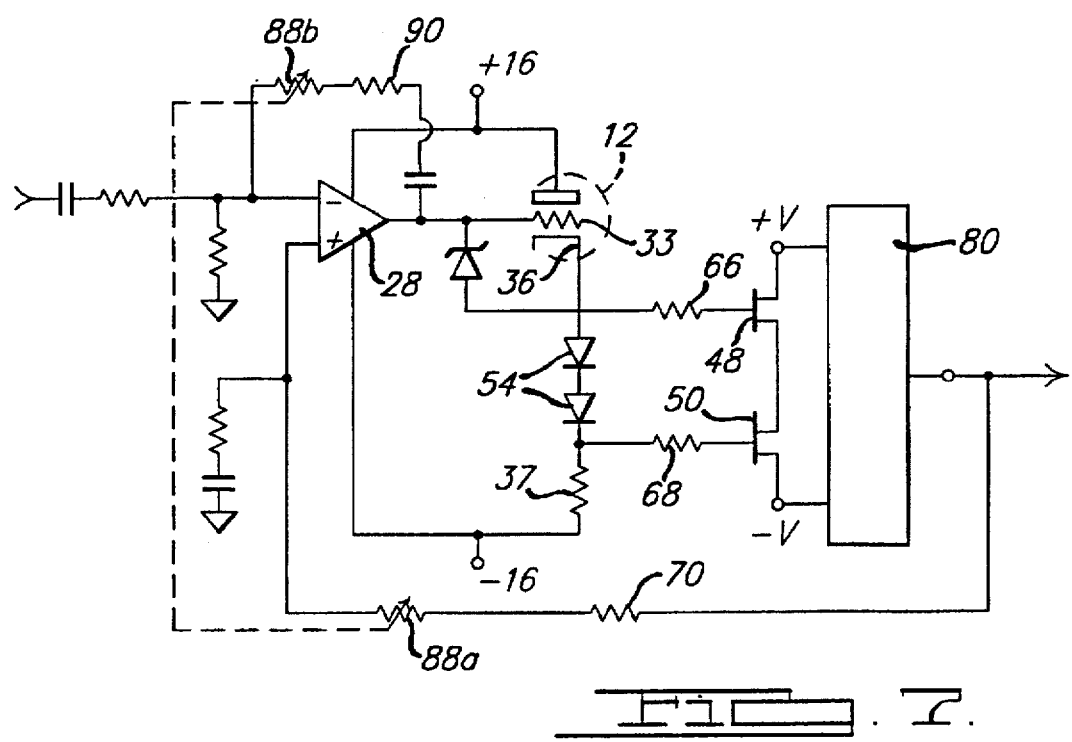
FIG. 7 is a schematic diagram illustrating a sixth preferred embodiment of the present invention.

An alternate embodiment, shown in FIG. 7, also employs the floating power supply 80. In the FIG. 7 embodiment the cathode 36 of vacuum tube 12 is coupled to the pull-down resistor 37 through the diodes 54, as illustrated. The power MOSFET transistors 48 and 50 are coupled through resistors 66 and 68 to opposite sides of the diodes 54, in a fashion similar to that of the FIG. 4 embodiment. Comparing the embodiments of FIGS. 6 and 7, the FIG. 6 embodiment is configured in a push/pull arrangement whereas the FIG. 7 embodiment is configured in a class A amplifier arrangement.

Also illustrated in FIG. 7 is another way of implementing the feedback adjustment for user control over the vacuum tube warming effect. A dual section potentiometer 88a and 88b is coupled in the global feedback loop (in series with feedback resistor 70) and in the local feedback loop (in series with the feedback resistor 90) respectively. Dual potentiometers 88a and 88b are driven by a common shaft that may be coupled to the adjustment knob 22 (FIG. 1). The potentiometers are wired so that turning the shaft in one direction increases local feedback and simultaneously decreases global feedback. This causes the warming effect of vacuum tube 12 to increase, as the vacuum tube is operated to less of a degree of closed loop control. Turning the potentiometer shaft in the opposite direction decreases local feedback and simultaneously increases global feedback. This places the vacuum tube under a greater degree of closed loop control, thereby reducing the amount of the vacuum tube warming effect.

Figure 8:
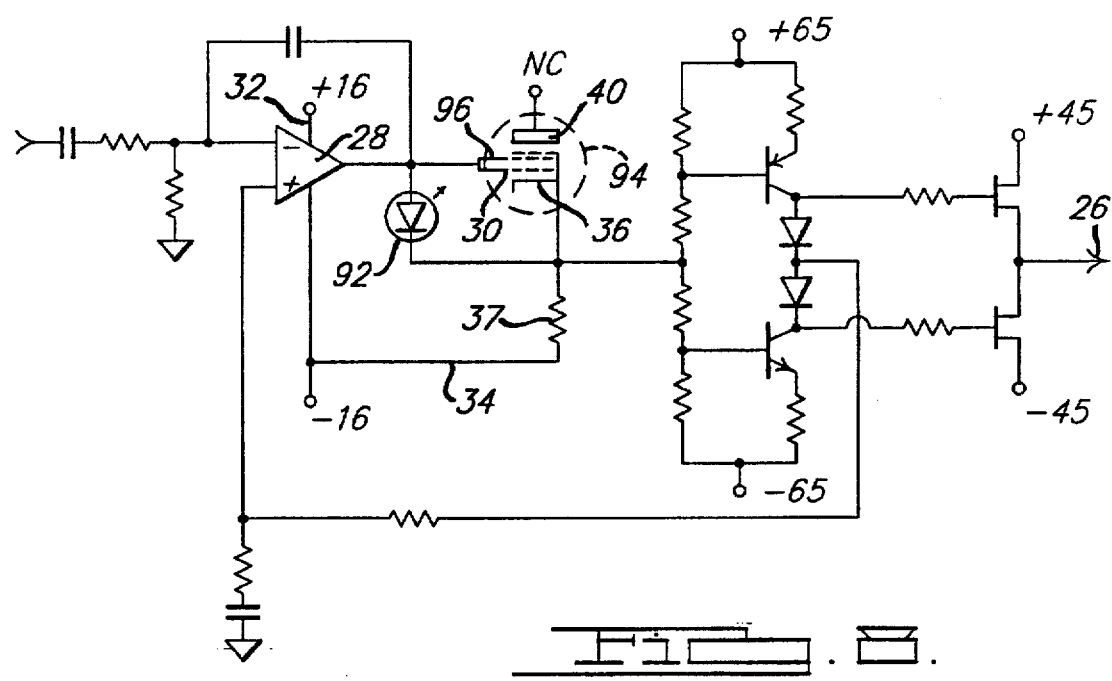
FIG. 8 is a schematic diagram illustrating a seventh preferred embodiment of the present invention.

FIG. 8 shows yet another embodiment of the invention, useful in illustrating some additional aspects of the invention. The embodiment of FIG. 8 is similar to the embodiment of FIG. 3, except that a light emitting diode 92 has been substituted for the Zener diode to serve as the vacuum tube bypass component. Also, a power pentode vacuum tube 94 has been illustrated. Note that the plate 40 of pentode 94 has not been connected to the positive supply rail 32. The cathode 36 is coupled through pull-down resistor 37 to the negative supply rail 34. The plate 40 could be connected to the positive supply rail 32, if desired. However, the plate is shown disconnected in this embodiment to illustrate one remarkable aspect of the invention. Ordinarily, a vacuum tube is operated with the plate connected to a supply rail, in order to establish a current flow through the tube. Typically, the input signal is applied to the control grid 30 to modulate the current flow between cathode 36 and plate. Here, however, the plate is not operatively connected to the circuit. Nevertheless, the vacuum tube supplies a warming coloration to the sound as the audio signal passes through the control grid 30 to the cathode 36. The plate 94 may also be connected directly to the control grid 30 with satisfactory performance observed.

As illustrated in FIG. 8, I directly couple the screen grid 96 to the control grid 30. I have discovered that this surprisingly reduces undesirable total harmonic distortion produced by the vacuum tube circuit compared to conventional "triode" wiring of power pentodes. To illustrate, I have powered a 6L6GC power pentode at ±40 volts and ±65 volts, respectively in a series of tests. The test involves applying a 20 volt RMS signal of 1000 hertz as an input to the power pentode and selectively connecting the screen grid to various other pins of the power pentode. The total harmonic distortion is then measured across a 4.7K ohm load connected between the negative supply rail and the cathode. The data presented in Table I shows that the total harmonic distortion is remarkably lower when the screen grid is connected to the control grid. The data in Table I shows that my results are better than the results obtained from a conventional practice of attaching the screen grid to the plate for "triode" operational mode.

TABLE I

| Screen Grid (Pin 4) Connection: | B+, B− Voltage | % THD (Distortion) |
| --- | --- | --- |
| To Pin 3 | 40 VDC | 1.10 |
| (Plate, Conventional) | 65 VDC | 0.80 |
| Open | 40 VDC | 0.81 |
| (No Connection) | 65 VDC | 0.41 |
| To Pin 5 | 40 VDC | 0.24 |
| (Control Grid, Novel) | 65 VDC | 0.13 |

It will be appreciated that the pentode 94 of FIG. 8 can be connected in any of the circuits previously described, in place of the triode vacuum tube 12 illustrated. Also, whereas the plate 40 of pentode 94 is not connected in FIG. 8, the presently preferred embodiment would connect the plate to the positive supply rail, as illustrated in the other circuit embodiments. Additionally it should be observed that this 6L6GC power pentode is being operated at substantially lower voltages than commonly or previously used in power pentode cathode follower circuits. Normal voltages for this type of operation is typically on the order of 250 volts or more. This is a particularly interesting and important aspect of my invention.

Figure 10:
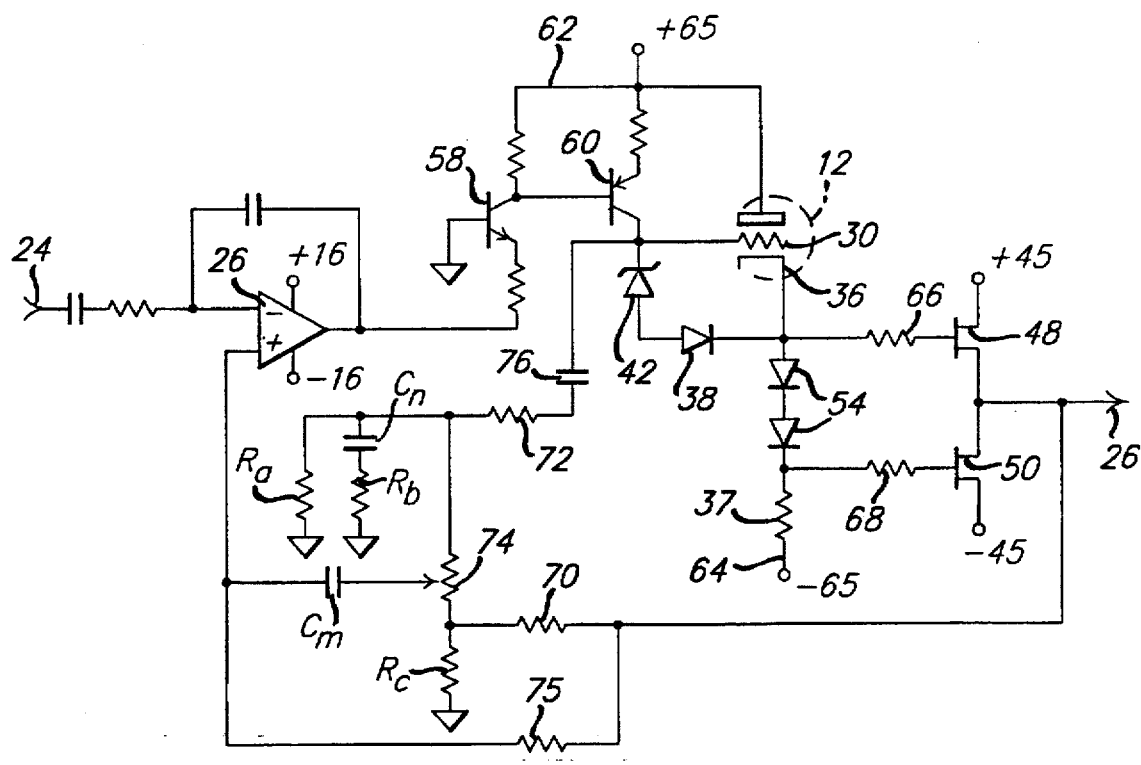
FIG. 10 is a schematic diagram of an 8th preferred embodiment of the present invention that employs supplemental feedback circuitry to augment the gain of the vacuum tube stage as the user adjusts the feedback level to increase the degree to which vacuum tube coloration is added to the overall sound.

Yet another embodiment of the invention is illustrated in FIG. 10. This embodiment adds a supplemental feedback circuit to increasingly augment the gain of the vacuum tube stage as the user adjustable feedback level is set to increase the degree to which vacuum tube sound is injected into the final output.

Referring to FIG. 10, local feedback is supplied through capacitor 76 and resistor 72. This signal is available at the top of potentiometer 74. When the potentiometer is adjusted towards the local feedback (top of pot) the gain is a function of resistor 72 and resistor $R_a$. High frequencies may be boosted by the addition of capacitor $C_n$ and resistor $R_b$.

Overall feedback is supplied to the bottom of potentiometer 74 through resistor 70. The gain in this case is supplied by the function of resistor 70 and resistor $R_c$. As in the previously illustrated embodiments, resistor 75 is on the order of 1.5 megohms and sets the output DC reference. Capacitor $C_n$ is on the order of 2 microfarads. The potentiometer 74 may be on the order of 10K ohms, resistors $R_a$ and $R_D$ on the order of 4.7K ohms, resistor 72 on the order of 330K ohms, resistor 70 on the order of 220K ohms, resistor 75 on the order of 1.5 megohms and capacitor $C_n$ and capacitor 76 on the order of 0.0047 microfarads.

Note that local feedback resistor 72 is larger in value, thus it supplies less feedback and increases the gain of the amplifier, while resistor 70 is smaller and results in less gain when more overall feedback is supplied. This circuit thus provides more gain to the vacuum tube stage as the user selectively operates the amplifier in the "tube" condition. Additionally, frequency tailoring is possible through the use of capacitor 76, for bass boosting characteristics, and resistor capacitor network $C_n$ and $R_b$, for high frequency boosting.

The circuit of FIG. 10 provides enhanced performance when the system is operated in the vacuum tube regime. From the previous discussion it will be understood that the hybrid amplifier operates in the vacuum tube regime when the feedback control is adjusted in the direction that bypasses the tube from the feedback loop. Bypassing the tube from the feedback loop introduces the characteristic "vacuum tube sound" more dramatically. This can, however, result in a slight signal output loss (on the order of 3 dB). This signal loss occurs at the frequencies where the speaker has its lowest impedance.

The reason for the loss is this. As the local feedback is increased (or the local feedback loop is closed) damping factors lower as well. As this is a rather "soft" amplifier (due to the high RDSon of the type of the output MOSFETs used) power is therefore reduced at lower impedance loads. The normal compensating drive signal from the output comparator is lessened (or eliminated) as the local feedback loop is closed, so the amplifier is literally left to drive the load as best it can. Although the amplifier sounds more musical, and the tube characteristics are more pronounced under this condition of power and volume loss, some listeners may perceive that the amplifier is not as loud when the tube characteristics are introduced. To prevent the amplifier from sounding less powerful in the vacuum tube mode, the additional feedback circuitry is employed.

The addition of this additional feedback circuitry greatly enhances the "tube sound" of the hybrid amplifier without any perceived power losses. The additional circuitry doubles the feedback and provides independent gain and frequency tailoring capabilities that become more pronounced as the system is operated in the vacuum tube regime.

Various other advantages of the present invention will become apparent to those skilled in the art after having the benefit of studying the foregoing text and drawings, taken in conjunction with the following claims.

What is claimed is:

1. A hybrid amplifier circuit of the type having amplifier input and output ports for inputting and outputting an audio signal, comprising:

a solid state amplifier stage for coupling to said amplifier input port and having a first stage output;

a vacuum tube stage having an input coupled to said first stage output and having a second stage output for coupling to said amplifier output port;

a bypass circuit coupled between the output of said solid state amplifier and said amplifier output port;

said bypass circuit being responsive to the operative state of said vacuum tube to automatically divert said audio signal around said vacuum tube stage when the vacuum tube is in a first state of operation and to automatically divert said audio signal through said vacuum tube when the vacuum tube is in a second state of operation.

2. The amplifier circuit of claim 1 wherein said solid state amplifier stage comprises an integrated circuit operational amplifier.

3. The amplifier circuit of claim 1 wherein said solid state amplifier stage comprises a discrete transistorized balanced or differential amplifier.

4. The amplifier circuit of claim 1 wherein the input of said vacuum tube stage is direct coupled to said first stage output.

5. The amplifier circuit of claim 1 wherein the input of said vacuum tube stage is direct current (DC) coupled to said first stage output to couple direct current signals from said solid state amplifier stage to said vacuum tube stage.

6. The amplifier circuit of claim 1 wherein said bypass circuit comprises a semiconductor junction biased for conduction when said vacuum tube is in said first state and biased for nonconduction when said vacuum tube is in said second state.

7. The amplifier circuit of claim 1 wherein said vacuum tube stage is configured as a cathode follower.

8. The amplifier circuit of claim 1 wherein said vacuum tube stage is configured to introduce even harmonic coloration of said audio signal.

9. The amplifier circuit of claim 1 further comprising a housing having a viewing window and wherein the vacuum tube stage includes at least one vacuum tube positioned within said viewing window and said amplifier circuit further comprising illumination means disposed in proximity to said one vacuum tube to illuminate the one vacuum tube and thereby provide a visual indication that the vacuum tube is operational.

10. The amplifier circuit of claim 1 further comprising user adjustable feedback circuit coupled around said vacuum tube stage for controlling the degree of harmonic coloration added to said audio signal by said vacuum tube stage.

11. The circuit of claim 1 wherein said vacuum tube stage comprises a power pentode configured as a direct coupled class A cathode follower.

12. The circuit of claim 1 wherein the vacuum tube stage is operated at a plate to cathode potential at substantially less than 250 volts.

13. The circuit of claim 1 wherein the bypass circuit further includes visually illuminated device for indicating tube warm-up and tube failure conditions.

14. A hybrid amplifier circuit of the type having amplifier input and output ports for inputting and outputting an audio signal, comprising:

a solid state amplifier stage for coupling to said amplifier input port and having a first stage output;

a vacuum tube stage for providing coloration to said audio signal having an input coupled to said first stage output and having a second stage output for coupling to said amplifier output port;

a user adjustable feedback circuit including frequency dependent component coupled around said vacuum tube stage for controlling the degree to which said vacuum tube stage is operated under closed loop control and thereby controlling the degree to which the vacuum tube stage provides coloration to said audio signal, stage output to couple direct current signals from said solid state amplifier stage to said vacuum tube stage.

15. The amplifier circuit of claim 14 wherein said solid state amplifier stage comprises an integrated circuit operational amplifier.

16. The amplifier circuit of claim 14 wherein said solid state amplifier stage comprises a discrete transistorized balanced or differential amplifier.

17. The amplifier circuit of claim 14 wherein the input of said vacuum tube state is direct coupled to said first stage output.

18. The amplifier circuit of claim 14 wherein the input of said vacuum tube state is direct current (DC) coupled to said first stage output to couple direct current signals from said solid state amplifier stage to said vacuum tube stage.

19. The amplifier circuit of claim 14 wherein said vacuum tube stage is configured as a cathode follower.

20. The amplifier circuit of claim 14 wherein said vacuum tube stage is configured to introduce even harmonic coloration of said audio signal.

21. The amplifier circuit of claim 14 further comprising a housing having a viewing window and wherein the vacuum tube stage includes at least one vacuum tube positioned within said viewing window and said amplifier circuit further comprising illumination means disposed in proximity to said one vacuum tube to illuminate the one vacuum tube and thereby provide a visual indication that the vacuum tube is operational.

22. The circuit of claim 14 further comprising supplemental feedback circuit that increasingly augments the gain of said vacuum tube stage as said user adjustable feedback circuit is varied to increase the degree to which said vacuum tube stage provides coloration to said audio signal.

23. A hybrid amplifier circuit of the type having amplifier input and output ports for inputting and outputting an audio signal, comprising:

a solid state amplifier stage for coupling to said amplifier input port and having a first stage output;

a vacuum tube stage having an input coupled to said first stage output and having a second stage output for coupling to said amplifier output port;

said vacuum tube stage employing a pentode having a cathode, a control grid and a screen grid;

said pentode being configured in a cathode follower configuration;

said vacuum tube stage further including a means for lowering the total harmonic distortion of the vacuum tube stage comprising a direct connection between said screen grid and said control grid.

24. The circuit of claim 23 wherein said pentode includes a plate and wherein said vacuum tube stage includes a bias circuit in which said plate is open circuited with respect to direct current (DC) potentials.

25. The circuit of claim 24 wherein said plate is not connected to said bias circuit.

26. The circuit of claim 24 wherein said plate and said screen grid and said control grid are all connected together and are separate from said bias circuit, but direct coupled to said amplifier output port.

27. The circuit of claim 23 further comprising a bypass circuit coupled between the output of said solid state amplifier and said amplifier output port;

said bypass circuit being responsive to the operative state of said vacuum tube to automatically divert said audio signal around said vacuum tube stage when the vacuum tube is in a first state of operation and to automatically divert said audio signal through said vacuum tube when the vacuum tube is in a second state of operation.

28. The circuit of claim 23 wherein said vacuum tube stage provides harmonic coloration to said audio signal and wherein said hybrid amplifier further comprises a user adjustable feedback circuit coupled around said vacuum tube stage for controlling the degree to which said vacuum tube stage is operated under closed loop control, thereby controlling the degree to which the vacuum tube stage provides coloration to said audio signal.

* * * * *